United States Patent
Cheng et al.

(10) Patent No.: US 9,524,784 B1
(45) Date of Patent: Dec. 20, 2016

(54) DEVICE AND METHOD FOR IMPROVED THRESHOLD VOLTAGE DISTRIBUTION FOR NON-VOLATILE MEMORY

(71) Applicant: MACRONIX INTERNATIONAL CO., LTD., Hsin-Chu (TW)

(72) Inventors: Cheng-Hsien Cheng, Yunlin County (TW); Chih-Wei Lee, New Taipei (TW); Shaw-Hung Ku, Hsinchu (TW); Wen-Pin Lu, Hsinchu County (TW)

(73) Assignee: MACRONIX INTERNATIONAL CO., LTD., Hsin-Chu (TW)

( * ) Notice: Subject to any disclaimer, the term of this patent is extended or adjusted under 35 U.S.C. 154(b) by 0 days.

(21) Appl. No.: 14/848,524

(22) Filed: Sep. 9, 2015

(51) Int. Cl.
| | | |
|---|---|---|
| *G11C 16/10* | (2006.01) | |
| *G11C 16/14* | (2006.01) | |
| *G11C 16/26* | (2006.01) | |
| *G11C 16/04* | (2006.01) | |
| *H01L 27/115* | (2006.01) | |

(52) U.S. Cl.
CPC ............ *G11C 16/14* (2013.01); *G11C 16/0466* (2013.01); *G11C 16/0483* (2013.01); *G11C 16/26* (2013.01); *H01L 27/1157* (2013.01); *H01L 27/11573* (2013.01); *H01L 27/11578* (2013.01)

(58) Field of Classification Search
CPC ................................ G11C 16/10; G11C 16/26
USPC ......................................... 365/185.17, 185.24
See application file for complete search history.

(56) References Cited

U.S. PATENT DOCUMENTS

| | | | | |
|---|---|---|---|---|
| 7,675,772 | B2 * | 3/2010 | Goda ................. | G11C 11/5628 365/185.03 |
| 2006/0140000 | A1 * | 6/2006 | Liao ................... | G11C 11/5671 365/185.17 |
| 2008/0123414 | A1 * | 5/2008 | Mokhlesi ........... | G11C 16/28 365/185.03 |
| 2009/0273979 | A1 * | 11/2009 | Aritome ............. | G11C 11/5628 365/185.17 |
| 2012/0250415 | A1 * | 10/2012 | Sharon ............... | G11C 11/5642 365/185.17 |
| 2013/0272067 | A1 * | 10/2013 | Lee .................... | G11C 16/0483 365/185.11 |
| 2015/0016190 | A1 * | 1/2015 | Hosono .............. | G11C 16/3427 365/185.17 |
| 2016/0093380 | A1 * | 3/2016 | Dong .................. | G11C 16/10 365/185.19 |

* cited by examiner

*Primary Examiner* — Michael Tran
(74) *Attorney, Agent, or Firm* — Alston & Bird LLP (57) ABSTRACT

The present invention provides methods and associated devices for controlling the voltage threshold distribution corresponding to performing a function on cells of non-volatile memory device. In one embodiment, a method is provided. The method may comprise providing the non-volatile memory device. The device comprises one or more strings, each string comprising a plurality of cells, the plurality of cells comprising a first cell and a second cell. The method further comprises performing a function of the non-volatile memory device by applying a first function voltage to the first cell and a second function voltage to the second cell. The first function voltage and the second function voltage are different.

17 Claims, 9 Drawing Sheets

DEVICE AND METHOD FOR IMPROVED THRESHOLD VOLTAGE DISTRIBUTION FOR NON-VOLATILE MEMORY

TECHNOLOGICAL FIELD

Embodiments of the present invention relate generally to semiconductor devices and, in particular, methods for improved program threshold voltage (Vt) distribution and operation of semiconductor memory devices.

BACKGROUND

Semiconductor devices are typically classified as either volatile semiconductor devices, which require power to maintain storage of data, or non-volatile semiconductor devices, which can retain data even upon removal of a power source. An example non-volatile semiconductor device is a flash memory device, which generally may be classified as NOR or NAND flash memory devices. Such flash memory devices may stack cells, or layers, on top of each other taking the form of a 3D architecture. When faster program and erase speeds are desired, 3D NAND flash memory is typically utilized, in large part, due to its serialized structure whereby program and erase operations may be performed on entire strings of memory cells. In vertical NAND strings, each layer has a different diameter due to a non-normal etching angle.

With respect to 3D NAND flash memory associated with circular cells, differences in the diameter induce different program performance which conventionally results in a broader program threshold voltage (Vt) distribution. The larger the diameter of the cell, the longer the corresponding program time. In this regard, such large diameters present challenges, such as programmatic inefficiencies with respect to program time. Additionally, as a string will include cells having varying diameters, the programming time for the string may be difficult to control. Accordingly, there is a need in the art to improve the program threshold voltage distribution of 3D NAND devices, which in turn improves (e.g., decreases) program time.

BRIEF SUMMARY OF EXEMPLARY EMBODIMENTS

Embodiments of the present invention provide improved operation of semiconductor devices and, in particular, methods for controlling program threshold voltage distribution corresponding to a non-volatile memory device, such as 3D NAND flash memory.

In one aspect of the present invention, a method for controlling the program threshold voltage distribution corresponding to a non-volatile memory device is provided. In one embodiment the method comprises providing the non-volatile memory device. The non-volatile memory device comprises one or more strings, each string comprises a plurality of cells, and the plurality of cells comprises a first cell and a second cell. The method further comprises performing a function of the non-volatile memory device by applying a first function voltage to the first cell and a second function voltage to the second cell. The first function voltage and the second function voltage are different.

In another aspect of the present invention, a non-volatile memory device for which the program threshold voltage distribution is controlled is provided. The non-volatile memory device comprises a plurality of cells along a string. The string comprises a channel region. Each cell comprises a word line disposed about the string. The plurality of cells comprises a first cell having a first word line and a second cell having a second word line. The first cell and the second cell are configured to have a function performed thereon by the application of a first function voltage to the first cell via the first word line and the application of a second function voltage to the second cell via the second word line. The first function voltage and the second function voltage are different.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE SEVERAL VIEWS OF THE DRAWINGS

Having thus described certain example embodiments of the present disclosure in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Although specific terms are employed herein, they are used in a generic and descriptive sense only and not for purposes of limitation. All terms, including technical and scientific terms, as used herein, have the same meaning as commonly understood by one of ordinary skill in the art to which this invention belongs unless a term has been otherwise defined. It will be further understood that terms, such as those defined in commonly used dictionaries, should be interpreted as having a meaning as commonly understood by a person having ordinary skill in the art to which this invention belongs. It will be further understood that terms, such as those defined in commonly used dictionaries, should be interpreted as having a meaning that is consistent with their meaning in the context of the relevant art and the present disclosure. Such commonly used terms will not be interpreted in an idealized or overly formal sense unless the disclosure herein expressly so defines otherwise.

As used herein, "gate structure" refers to a component of a semiconductor device, such as a memory device. Non-limiting examples of memory devices include flash memory devices (e.g., a NAND flash memory device). Erasable programmable read-only memory (EPROM) and electrically erasable read-only memory (EEPROM) devices are non-limiting examples of flash memory devices. The gate structures of the invention may be a gate structure assembly capable of operating in memory devices or a sub-assembly of a component or components of such gate structures.

As used herein, a "non-volatile memory device" refers to a semiconductor device which is able to store information even when the supply of electricity is removed. Non-volatile memory includes, without limitation, Mask Read-Only Memory, Programmable Read-Only Memory, Erasable Programmable Read-Only Memory, Electrically Erasable Programmable Read-Only Memory, and Flash Memory, such as NAND and NOR flash memory.

As used herein, a "substrate" may include any underlying material or materials upon which a device, a circuit, an epitaxial layer, or a semiconductor may be formed. Generally, a substrate may be used to define the layer or layers that underlie a semiconductor device or even forms the base layer of a semiconductor device. The substrate may include one or any combination of silicon, doped silicon, germanium, silicon germanium, semiconductor compounds, or other semiconductor materials.

The gate structure (e.g., a non-volatile memory device) of the invention and methods provide for improved program threshold voltage distribution for non-volatile memory devices configured for random access, such as 3D NAND flash memory. To that end, the programming speed that may be experienced by a non-volatile memory device is increased based on a non-uniform program voltage.

The present invention relates to a number of functions, including program (e.g., PGM), erase (e.g., ERS), read (e.g., READ) functions or any other function where a voltage is applied to multiple cells on the same string. The present invention may be practiced with various types of devices and/or memory cells including 3D NAND flash memory, other non-volatile memory devices such as 3D NOR, 3D ROM, 2D NAND, or 2D NOR, MOS cells under regular arrangement, or any other device configured for voltage control under regular arrangement. For the sake of illustration, the example of a programming a 3D NAND flash memory is provided herein. One of ordinary skill will, based on the disclosure provided herein, understand how to apply the present invention to other functions and other types of devices.

Figure 1A:
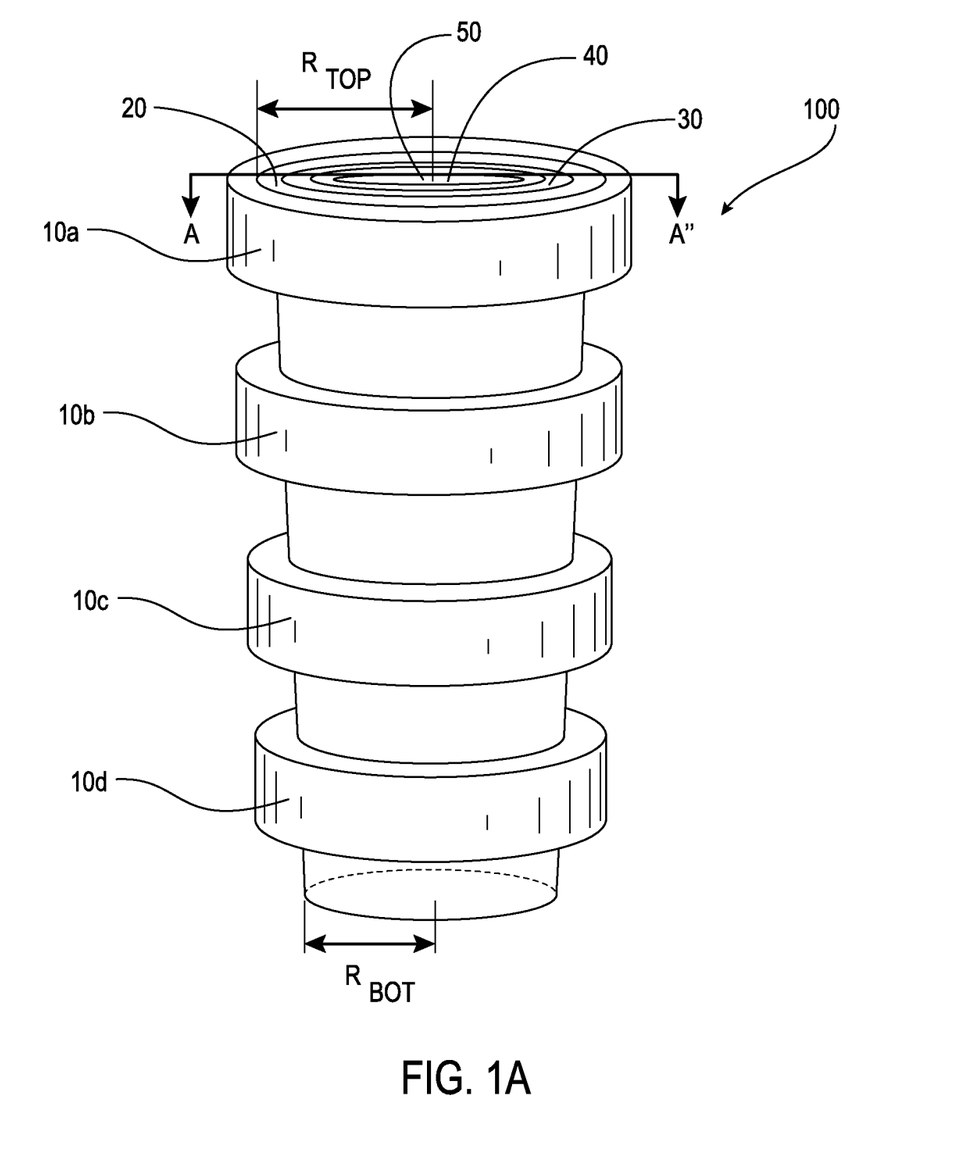
FIG. 1A illustrates a perspective view of an example string of an example non-volatile memory device that may be used in accordance with embodiments of the present invention.
Figure 1B:
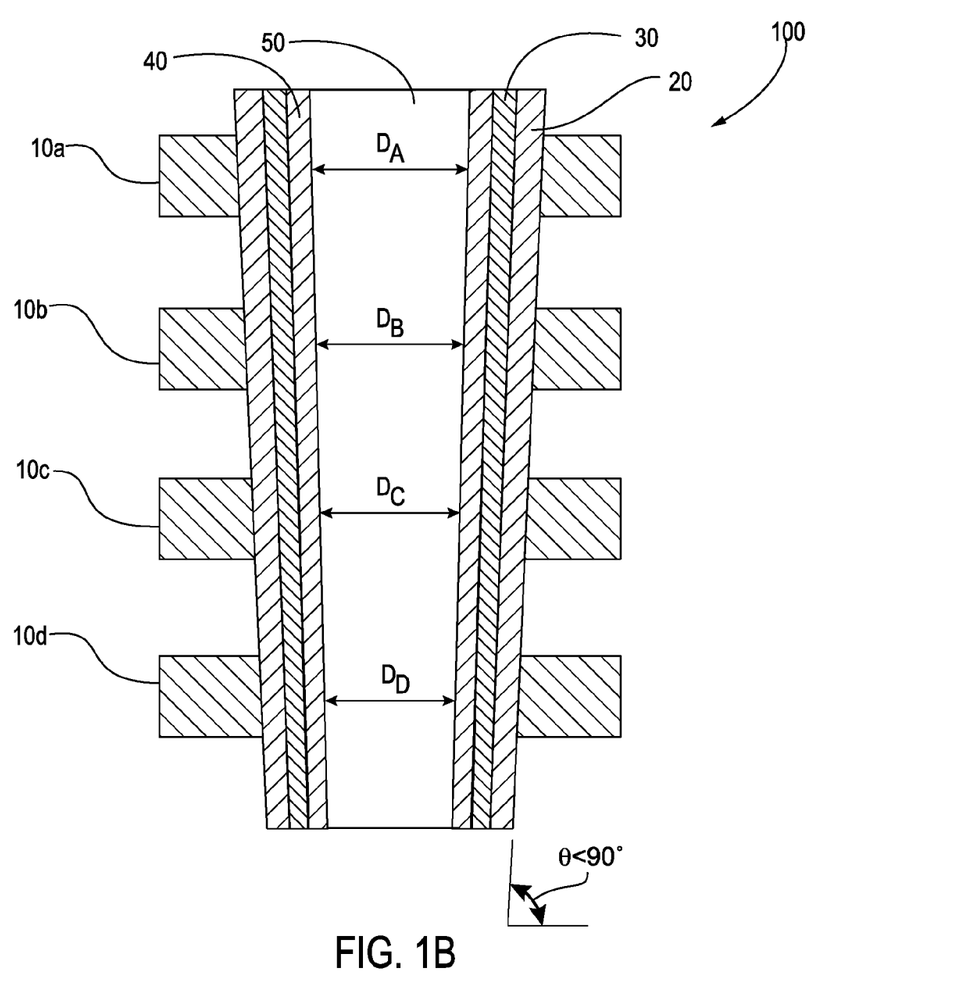
FIG. 1B is a cross-sectional view of the string shown in FIG. 1A.

FIGS. 1A and 1B illustrate a portion of a non-volatile memory device (e.g., 3D NAND flash memory). The illustrated portion of the non-volatile memory device comprises a vertical string 100, comprising a plurality of memory cells. The illustrated string 100 comprises four cells; however, in various embodiments, the string 100 may comprise more than four cells or less than four cells, as appropriate for the application. In general, the string 100 comprises a generally cylindrical portion having word lines 10a, 10b, 10c, and 10d (e.g., one word line corresponding to each cell) wrapped there around. It's important to note that while the string 100 is generally cylindrical, it is actually slightly conical. The process through which the layers of the string are etched causes the string to be slightly off from normal. Thus, the exterior angle, θ, is less than 90°. This causes the radius at the top of the string, $R_{TOP}$, to be greater than the radius at the bottom of the string, $R_{BOT}$. Thus, the channel width for each cell of the string 100 differs from the neighboring cell channel width (e.g., $D_A > D_B > D_C > D_D$).

In general, the NAND string 100 comprises a tunnel layer 40, a trapping layer 30, and a blocking layer or dielectric layer 20 wrapped around a channel region 50. In various embodiments, the tunnel layer 40 may be made of oxide and be approximately 5 nm thick. In some embodiments, the blocking or dielectric layer 20 may be made of oxide and be approximately 7 nm thick. The channel region 50 may comprise polysilicon material or other appropriate material. Word lines (e.g., 10a, 10b, 10c, and 10d) are wrapped around the blocking or dielectric layer 20 such that there is one word line per cell. The word lines (e.g., 10a, 10b, 10c, and 10d) may be made of a polysilicon material, metal, or other appropriate material.

Figure 2A:
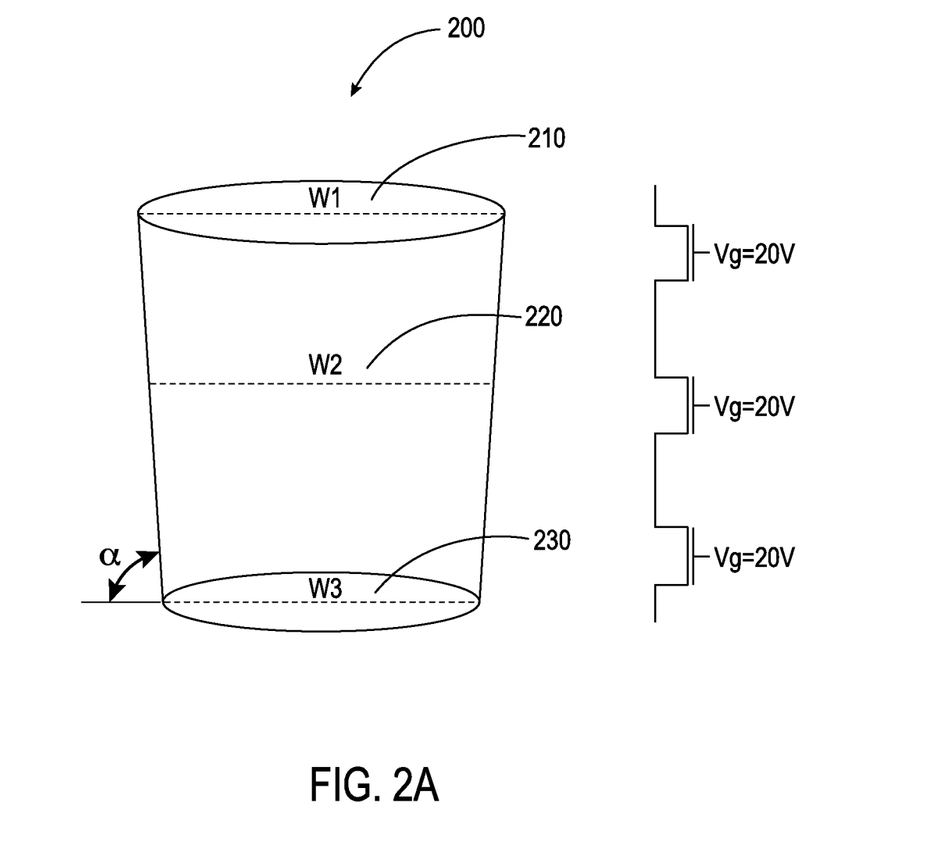
FIGS. 2A and 2B illustrate the conventional operation of a portion of a string and the resulting broad variation in threshold voltage of cells along the string.
Figure 2B:
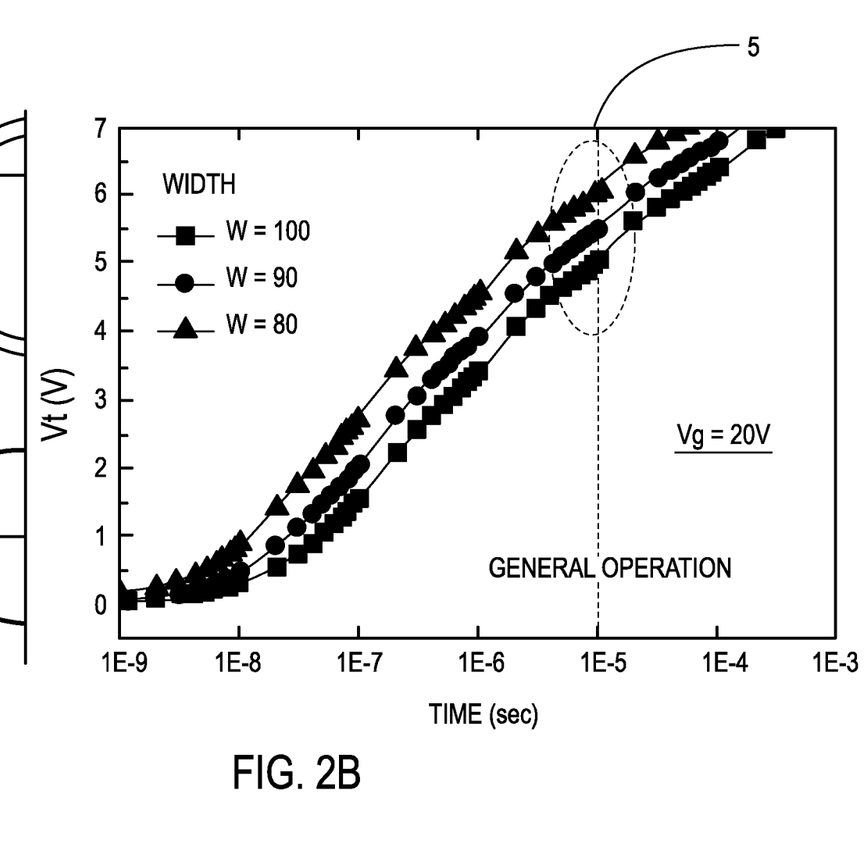

FIGS. 2A and 2B illustrate the normal operation of a NAND string 200 having three cells 210, 220, and 230. In this example, cell 210 has a channel diameter or width of 100 nm, cell 220 has a channel diameter or width of 90 nm, and cell 230 has a channel diameter or width of 80 nm. During the programming function, a uniform voltage $V_g=20V$ is applied to each of the cells via their respective word lines. As the programming function is conducted, the program threshold voltage distribution widens due to the difference in speed of the cells due to the difference in the channel diameter or width of the cells. Thus, according to this example, as the uniform voltage 20V is applied, the program voltage over time results in a broad program threshold voltage variation 5 due to the difference in the widths of each of the three cells 210, 220, and 230. As illustrated, the larger the channel width of a cell, the longer the corresponding program time for the cell is. The inverse relationship results as well in that the smaller the channel width of a cell the shorter the corresponding program time of the cell is. As shown in FIG. 2B, the program threshold voltage variation 5 of the three cells at time $1\times10^{-5}$ seconds is approximately 1-1.5 V. Thus, the variation between the three cells is approximately 20% of the threshold voltage of each of the cells due to the difference in the channel width between the three cells.

Figure 3A:
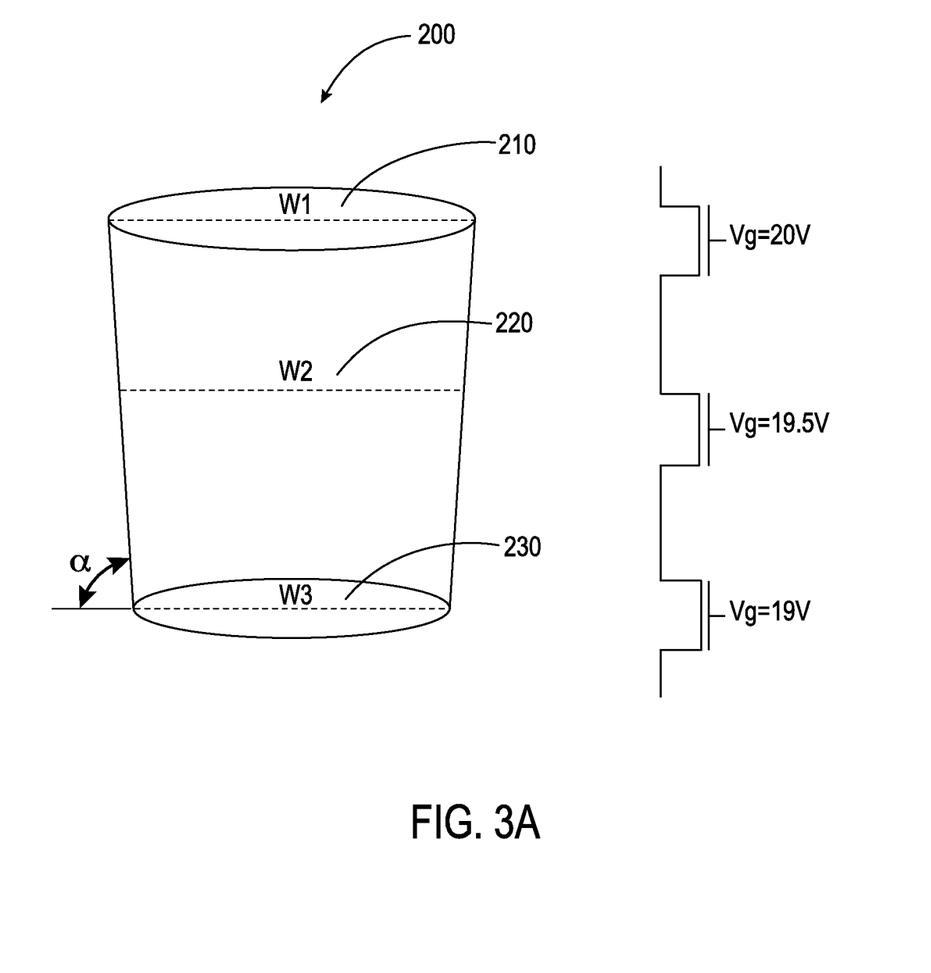
FIGS. 3A and 3B illustrate an example operation of a portion of a string in accordance with embodiments of the present invention and the corresponding improved (reduced) variation the threshold voltage of cells along the string.
Figure 3B:
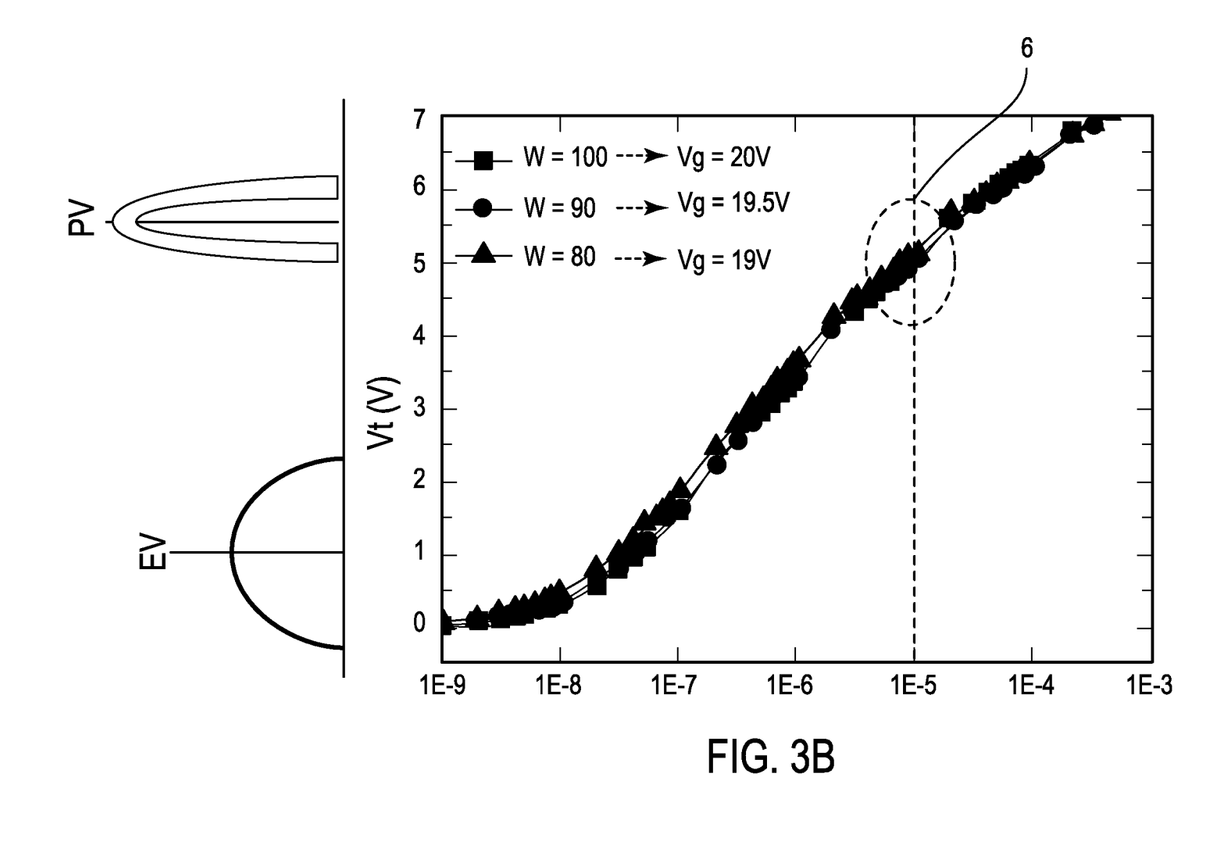

The present invention provides a method for reducing the variation of threshold voltages for cells along the string and thereby tightening the distribution of threshold voltages. FIGS. 3A and 3B illustrate an example of this method. FIG. 3A illustrates the example string 200 having cells 210, 220, and 230, where, in the present example, cell 210 has a channel diameter or width of 100 nm, cell 220 has a channel diameter or width of 90 nm, and cell 230 has a channel diameter or width of 80 nm. Rather than applying a uniform voltage of 20 V to each cell via the corresponding word line, a non-uniform voltage is applied. Thus, the word line of cell 210 applies a programming voltage $V_g=20V$ to cell 210, the word line of cell 220 applies a programming voltage $V_g=19.5$ V to cell 220, and the word line of cell 230 applies a programming voltage of $V_g=19$ V to cell 230. Thus, a smaller programming voltage is applied to cells having a smaller channel diameter or width than the programming voltage applied to cells having a larger channel diameter or width. FIG. 3B illustrates the variation in threshold voltage for these three cells as a function of time when operated with the non-uniform programming voltage. In particular, at time $1\times10^{-5}$ seconds the variation of the threshold voltage 6 for these three cells is minimal. To that end, applying a non-uniform voltage decreases the program threshold voltage variation as between each cell and reduces the program time.

In various embodiments, the programming voltage applied to each cell of a string via the corresponding word line may be configured to minimize the variation of the threshold voltage for the cells on the string. For example, the programming voltage, $V_g$, for each cell of the string may be different. In other embodiments, the string may be divided into two sections or groups wherein a first programming voltage is applied to cells having a channel diameter or width equal to or greater than a threshold value and a second programming voltage is applied to cells having a channel diameter or width less than the threshold value. In this example, the first programming voltage would be greater than the second programming voltage. In various embodiments, multiple threshold widths may be used to divide the string into a plurality of sections or groups wherein cells of each section or group are provided a particular programming voltage.

In various embodiments, the difference in the programming voltage applied to two cells may be based on the difference in channel width between the two cells. In other embodiments, the difference in programming voltage between two neighboring cells may be a predetermined difference in programming voltage that is not based on the difference in channel width between the neighboring cells. For example, in some embodiments, the difference in programming voltage between any pair of neighboring cells is the same. This is referred to herein as a regular programming voltage distribution. Thus, in the above example, the difference between the programming voltages applied to cells 210 and 220 is the same as the difference between the programming voltages applied to cells 220 and 230. In other embodiments, the difference in programming voltage between a first pair of neighboring cells and a second pair of programming cells may be different. This is referred to herein as an irregular programming voltage distribution. For example, the difference between the programming voltages applied to cells 210 and 220 is different than the difference between the programming voltages applied to cells 220 and 230.

One of skill in the art will understand that the distribution of programming voltages applied to the cells of a particular string may be configured to minimize the variation in threshold voltage for the cells of the particular string while taking into account other operational constraints. For example, the same distribution of programming voltages may be applied to each string comprising the semiconductor device. In another example, the device may be limited to only providing k (k a positive integer) different programming voltages along each string, but the string may comprise n (n a positive integer) different cells.

Figure 4A:
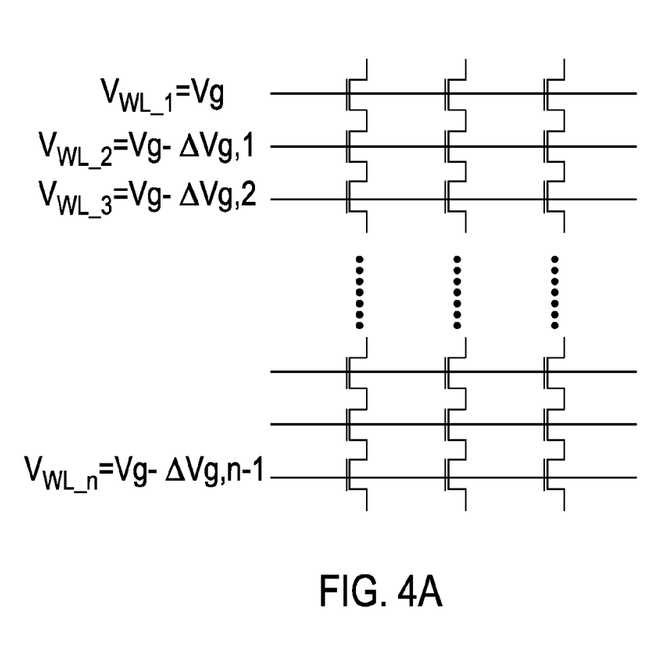
FIGS. 4A and 4B illustrate example program algorithms that may be used in accordance with various embodiments of the present invention.
Figure 4B:
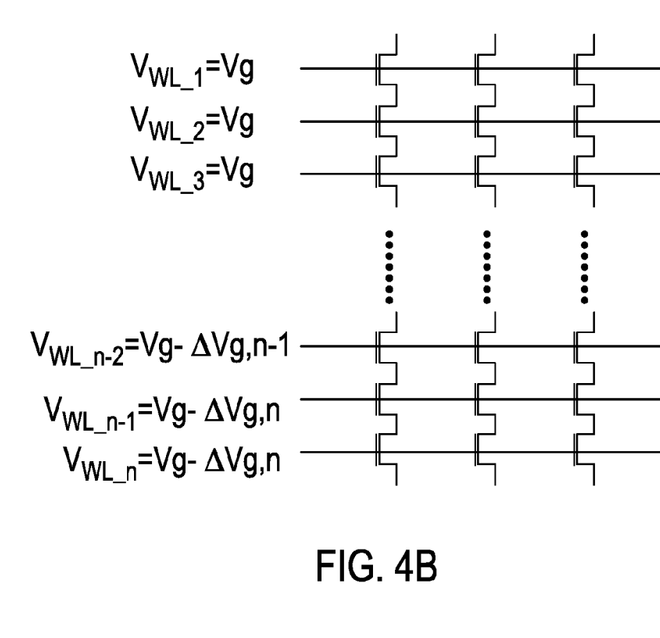

FIGS. 4A and 4B illustrate two example distributions of programming voltages applied to the n cells of a string, where $\Delta V_g$ is a change in the programming voltage. For example, in the example illustrated in FIGS. 3A and 3B, $\Delta V_g = 0.5V$ for both the difference between the programming voltages applied to cell 210 and cell 220 and the difference between the programming voltages applied to cell 220 and cell 230. As noted above, in various embodiments, the programming voltage distribution may be regular (e.g., the $\Delta V_g$ between any two neighboring cells or groups may be a constant) or the programming voltage distribution may be irregular (e.g., the $\Delta V_g$ between neighboring cells or groups may be different).

Figure 5:
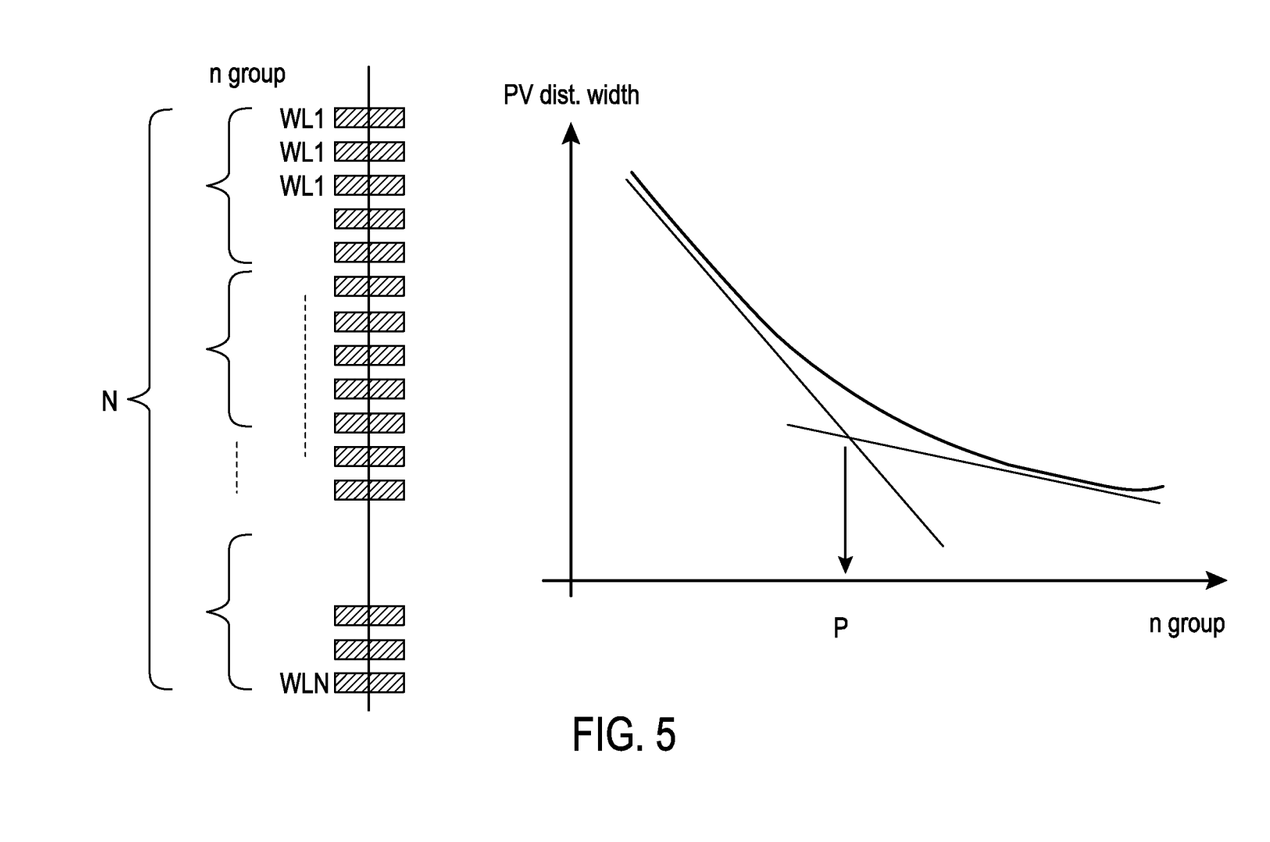
FIG. 5 illustrates an example graph of improved program threshold voltage distribution based on a group according to an embodiment of the invention.

FIG. 5 illustrates an example string comprising N (N a positive integer) cells. Each cell corresponds to a word line as indicated by the illustrated WL1, WL2, WL3, ..., WLN. The N cells are divided into n (n a positive integer less than or equal to N) groups. In some embodiments, the number of cells in each group is the same. In other embodiments, some groups may have different numbers of cells therein; however, each group has at least one cell therein. Each group has a particular programming voltage applied thereto. For example group 1 may consist of 5 cells having the largest channel widths of all the cells along the string and group 2 may consist of 4 cells having the smallest channel widths of all the cells along the string. A first programming voltage may be applied to the cells of group 1 via their corresponding word lines and a second programming voltage may be applied to the cells of group 2 via their corresponding word lines. In this example, the first programming voltage is larger than the second programming voltage.

The graph on the right hand side of FIG. 5 shows the effect on the distribution of threshold voltages due to the number of groups n of cells along the string, wherein each group of cells has a particular programming voltage applied thereto and each group has a different particular programming voltage applied thereto. For example, all the cells in group 1 have a first programming voltage applied thereto and all the cells of group 2 have a second programming voltage applied thereto and the first programming voltage does not equal the second programming voltage. When the number of groups n of cells along the string is small, dividing the cells along the string into n+1 groups significantly reduces the width of the distribution of threshold voltages compared to when the cells along the string are divided into n groups. However, after a point P, increasing the number of groups only mildly reduces the width of the distribution of threshold voltages. Thus, in one embodiment, the number of groups used aligns with the point P such that the distribution of threshold voltages is reduced while minimizing the effect of applying the non-uniform programming voltages on other performance characteristics of the memory device.

Figure 6:
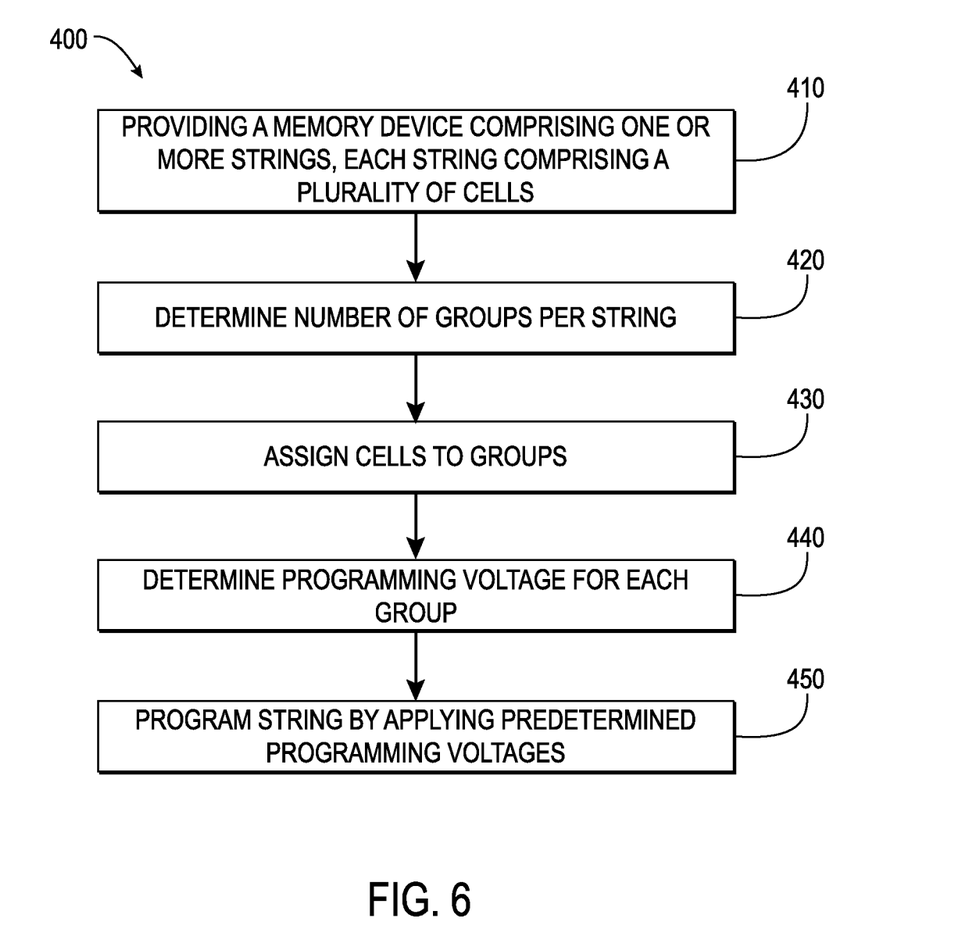
FIG. 6 is a flowchart illustrating a process for controlling voltage distribution according to an embodiment of the invention.

FIG. 6 is a flowchart illustrating a process 400 for controlling program threshold voltage distribution corresponding to a non-volatile memory device according to an embodiment of the invention. The process 400 begins at step 410 by providing a memory device (e.g., a 3D NAND flash memory device). The memory device may comprise one or more strings, each string comprising a plurality of cells, for example as illustrated in FIGS. 1A and 1B. Each cell corresponds to a portion of the channel region of the string. The portion of the channel region having a particular channel width associated therewith. At step 420, the number of groups per string to be used is determined. For example, in one embodiment, an analysis similar to that shown in FIG. 5 may be completed to determine the optimal number of groups for the string. In other embodiments, operational constraints or other limitations may be used to determine the number of groups per string. At step 430, the cells of the string are assigned to groups. For example, the first five cells of a string may be assigned to group 1, the next five cells along the string may be assigned to group 2, and so on.

At step 440, the distribution of programming voltages to be applied to each group is determined. In various embodiments, this step may comprise an analysis of the channel widths of the cells of the group (e.g., comparing an average channel width for cells of group 1 to an average channel width for cells of groups 2 to determine the difference in programming voltage between group 1 and group 2). In various embodiments, the cells of the string are not divided into groups, and a programming voltage for each cell is determined. In some embodiments, the distribution of programming voltages may be determined based on operational constraints, and/or other considerations.

At step 450, the programming function is carried out. For example, the cells of the string may be programmed by applying a programming voltage to each cell via the corresponding word line. The programming voltage applied to each cell may be based on the predetermined distribution of programming voltages. Indeed, a distribution of programming voltages are applied to the cells along the string such that the programming voltage applied to one cell on the string and a programming voltage applied to a second cell on the string are different, thereby reducing the variation of threshold voltages for cells along the string. One of skill should understand that, as noted above, this method may be used with various functions including program, erase, read, and other functions wherein voltages are applied to cells on the same string. Further, it should be understood that this method may be used with various types of semiconductor devices, including non-volatile memory devices such as 3D NOR, 3D ROM, 2D NAND, 3D NAND, 2D NOR, MOS cells under regular arrangement, or any other device configured for voltage control under regular arrangement.

In various embodiments, steps 420-440 may be completed once for the device. Then, each time the function (e.g., PGM, ERS, Read, etc.) is performed, the predetermined voltage distribution is applied as described herein to control the variation of threshold voltages of cells along each string. For example, rather than complete steps 420-440 to determine the voltage distribution each time a function is to be performed, the predetermined voltage distribution may be accessed and applied.

An aspect of the invention provides a non-volatile memory device configured according to a method of the invention.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method for controlling a threshold voltage distribution corresponding to a non-volatile memory device, the method comprising:
providing the non-volatile memory device, the device comprising one or more strings, each string comprising a plurality of cells, the plurality of cells comprising a first cell and a second cell;
performing a function of the non-volatile memory device by applying a first function voltage to the first cell and a second function voltage to the second cell, wherein the first function voltage and the second function voltage are different,
wherein the first cell comprises a channel region defined by a first width and the second cell comprises a channel region defined by a second width, the first width being different than the second width.

2. The method of claim 1 wherein the function is one of program, erase, or read.

3. The method of claim 1 wherein the difference between the first function voltage and the second function voltage corresponds to the difference between the first width and the second width.

4. The method of claim 1 wherein the first width is greater than the second width and the first function voltage is greater than the second function voltage.

5. The method of claim 1 wherein the plurality of cells are divided into a plurality of groups, each group comprising at least one cell and at least one group comprising a plurality of cells, the plurality of groups comprising a first group comprising the first cell and a second group comprising the second cell, and wherein performing the function comprises applying the first function voltage to each cell of the first group and applying the second function voltage to each cell of the second group.

6. The method of claim 1 wherein the first function voltage is applied to the first cell via a first word line associated with the first cell and the second function voltage is applied to the second cell via a second word line associated with the second cell.

7. The method of claim 1 wherein the non-volatile memory device is one of a flash memory device, 3D NOR memory device, 3D ROM memory device, 2D NAND memory device, 3D NAND memory device, 2D NOR memory device, MOS device having cells under regular arrangement, or a device configured for voltage control under regular arrangement.

8. The method of claim 1 wherein the plurality of cells comprises a third cell and the performing the function comprises applying a third function voltage to the third cell, the third function voltage being the same as the second function voltage.

9. The method of claim 1 wherein the first function voltage and the second function voltage are in accordance with a predetermined function voltage distribution.

10. The method of claim 9 wherein the predetermined function voltage distribution is irregular.

11. The method of claim 9 wherein the predetermined function voltage distribution is regular.

12. The method of claim 1, wherein performing the function takes less time than if the function were performed by applying a uniform function voltage to each of the plurality of cells.

13. A non-volatile memory device comprising:
a plurality of cells along a string, wherein:
the string comprises a channel region,
each cell comprises a word line disposed about the string,
the plurality of cells comprises a first cell having a first word line and a second cell having a second word line,
the first and second cells configured to have a function performed thereon by the application of a first function voltage to the first cell via the first word line and a second function voltage to the second cell via the second word line, and the first function voltage and the second function voltage are different, wherein a portion of the channel region corresponding to the first cell is defined by a first channel width and a portion of the channel region corresponding to the second cell is defined by a second channel width, the first channel width being larger than the second channel width and wherein the first function voltage is larger than the second function voltage.

14. The non-volatile memory device of claim 13 wherein the function is one of program, erase, and read.

15. The non-volatile memory device of claim 13 wherein the channel region is semi-conical and the string further comprises:

a tunnel layer disposed about the channel region,
a trapping layer disposed about the tunnel layer, and
a blocking layer disposed about the trapping layer, each word line being disposed about a portion of the blocking layer.

16. The non-volatile memory device of claim 13 wherein the plurality of cells are divided into a plurality of groups, each group comprising at least one cell and at least one group comprising a plurality of cells, the plurality of groups comprising a first group comprising the first cell and a second group comprising the second cell, and wherein performing the function comprises the application of the first function voltage to each cell of the first group and the application of the second function voltage to each cell of the second group.

17. The non-volatile memory device of claim 13 wherein the plurality of cells further comprises a third cell, the third cell being configure to have a function performed thereon through application of a third function voltage, the third function voltage being the same as the second function voltage.

* * * * *

UNITED STATES PATENT AND TRADEMARK OFFICE
CERTIFICATE OF CORRECTION

PATENT NO. : 9,524,784 B1
APPLICATION NO. : 14/848524
DATED : December 20, 2016
INVENTOR(S) : Cheng et al.

Page 1 of 1

It is certified that error appears in the above-identified patent and that said Letters Patent is hereby corrected as shown below:

On the Title Page

"Item (72) Inventors: Chang-Hsien Cheng, Yunlin County (TW); Chih-Wei Lee, New Tapei (TW); Shaw-Hung Ku, Hsinchu (TW); Wen-Pin Lu, Hsinchu County (TW)"

Should read:

--(72) Inventors: Chang-Hsien Cheng, Yunlin County (TW); Chih-Wei Lee, New Tapei City (TW); Shaw-Hung Ku, Hsinchu City (TW); Wen-Pin Lu, Hsinchu County (TW) --

Signed and Sealed this
Second Day of January, 2018

Joseph Matal
*Performing the Functions and Duties of the*
*Under Secretary of Commerce for Intellectual Property and*
*Director of the United States Patent and Trademark Office*